United States Patent [19]
Hembree et al.

[11] Patent Number: 6,060,894
[45] Date of Patent: May 9, 2000

[54] TEMPORARY PACKAGE, METHOD AND SYSTEM FOR TESTING SEMICONDUCTOR DICE HAVING BACKSIDE ELECTRODES

[75] Inventors: David R. Hembree; Salman Akram, both of Boise; Warren M. Farnworth, Nampa; James M. Wark, Boise, all of Id.

[73] Assignee: Micron Technology, Inc., Boise, Id.

[21] Appl. No.: 09/365,676

[22] Filed: Aug. 2, 1999

Related U.S. Application Data

[62] Division of application No. 08/812,098, Mar. 3, 1997.

[51] Int. Cl.⁷ ..................................... G01R 31/26
[52] U.S. Cl. ........................... 324/755; 324/765
[58] Field of Search ...................... 324/754, 755, 324/757, 765; 438/15, 17, 117; 29/846

[56] References Cited

U.S. PATENT DOCUMENTS

| | | |
|---|---|---|
| 4,169,642 | 10/1979 | Mouissie . |
| 4,783,719 | 11/1988 | Jamison et al. . |
| 5,006,792 | 4/1991 | Malhi et al. . |
| 5,073,117 | 12/1991 | Malhi et al. . |
| 5,088,190 | 2/1992 | Malhi et al. . |
| 5,123,850 | 6/1992 | Elder et al. . |
| 5,302,891 | 4/1994 | Wood et al. . |
| 5,322,446 | 6/1994 | Cearley-Cabbiness . |
| 5,367,253 | 11/1994 | Wood et al. . |
| 5,397,245 | 3/1995 | Roebuck et al. . |
| 5,408,190 | 4/1995 | Wood et al. . |
| 5,414,372 | 5/1995 | Levy . |
| 5,440,240 | 8/1995 | Wood et al. . |
| 5,451,165 | 9/1995 | Cearley-Cabbiness et al. . |
| 5,483,174 | 1/1996 | Hembree et al. . |
| 5,495,179 | 2/1996 | Wood et al. . |
| 5,517,125 | 5/1996 | Posedel et al. . |
| 5,519,332 | 5/1996 | Wood et al. . |
| 5,530,376 | 6/1996 | Lim et al. . |
| 5,541,525 | 7/1996 | Wood et al. . |
| 5,543,725 | 8/1996 | Lim et al. . |
| 5,742,169 | 4/1998 | Akram et al. . |
| 5,783,461 | 7/1998 | Hembree . |
| 5,815,000 | 9/1998 | Farnworth et al. . |
| 5,834,945 | 11/1998 | Akram et al. . |
| 5,844,418 | 12/1998 | Wood et al. . |
| 5,878,485 | 3/1999 | Wood et al. . |
| 5,896,036 | 4/1999 | Wood et al. . |
| 5,929,647 | 7/1999 | Akram et al. ........................... 324/755 |
| 5,982,185 | 11/1999 | Farnworth . |

Primary Examiner—Glenn W. Brown
Attorney, Agent, or Firm—Stephen A. Gratton

[57] ABSTRACT

A temporary package, a method, and a system for testing a semiconductor die having a backside electrode are provided. The temporary package includes a base for retaining the die; a conductive member for electrically contacting the backside electrode on the die; and terminal contacts in electrical communication with the conductive member. The package also includes a force applying mechanism for biasing the conductive member against the backside electrode. A conductive path between the conductive member and terminal contacts can be through a wire, or through the force applying mechanism. In an alternate embodiment the temporary package includes a base and terminal contacts formed in the configuration of a conventional semiconductor package. A cover for the base can include a metal, carbon filled elastomer, conductive foam, or conductive adhesive conductive member. The conductive member can be adapted to simultaneously contact the backside electrode on the die, and a mating contact on the base in electrical communication with the terminal contact. In addition, the conductive member can function as a heat sink for cooling the die during the test procedures.

24 Claims, 3 Drawing Sheets

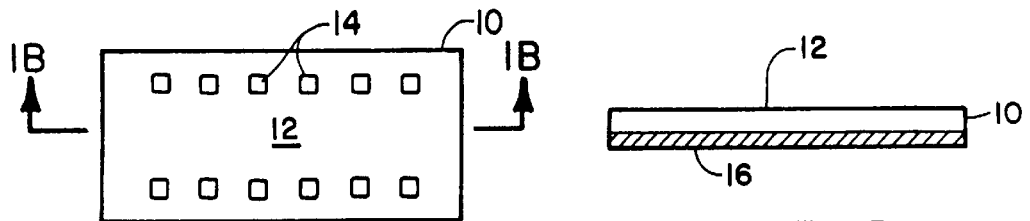
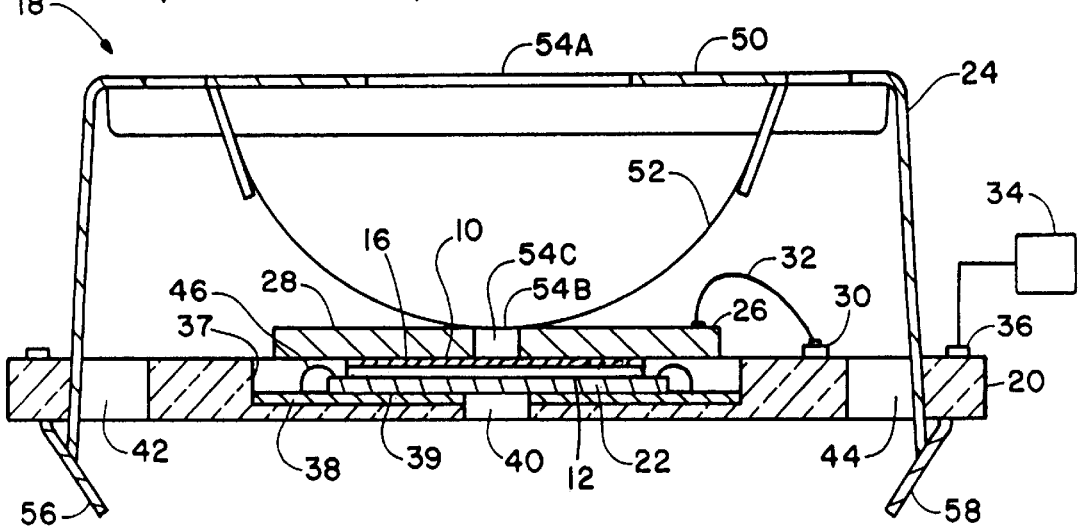
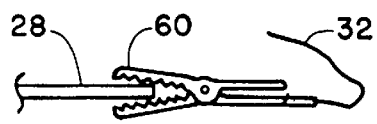
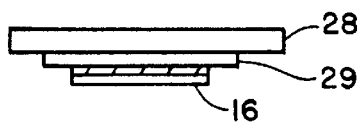
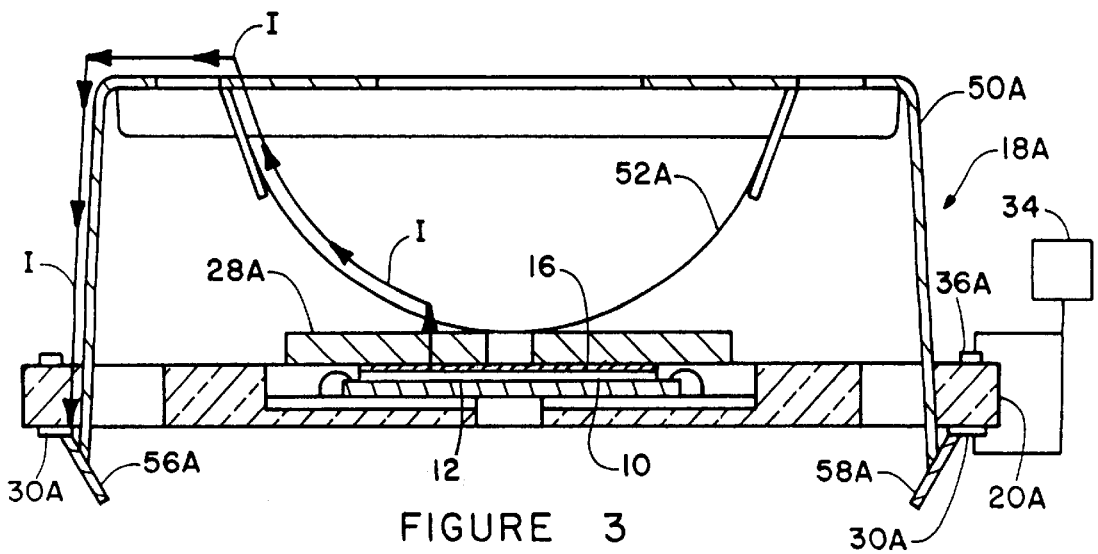

TEMPORARY PACKAGE, METHOD AND SYSTEM FOR TESTING SEMICONDUCTOR DICE HAVING BACKSIDE ELECTRODES

CROSS REFERENCE TO RELATED APPLICATIONS

This application is a division of application Ser. No. 08/812,098, filed Mar. 3, 1997.

FIELD OF THE INVENTION

This invention relates generally to semiconductor manufacture and more particularly to a temporary package, a method and a system for testing semiconductor dice having a backside electrode.

BACKGROUND OF THE INVENTION

Semiconductor manufacturers are required to test semiconductor dice to evaluate the electrical characteristics of the integrated circuits formed on the dice. For testing a semiconductor die, temporary electrical connections must be made to the die. With a packaged die, the electrical connections can be made to the external leads of the die. With an unpackaged die, electrical connections can be made to contact locations on the die using a temporary package for the die. Typically, the contact locations are bond pads, test pads, or fuse pads formed on the face (i.e., circuit side) of the die. The temporary package can include contact members configured to electrically engage the contact locations on the die.

One type of semiconductor die, in addition to having contact locations on its face, also includes an electrode formed on the backside of the die. The backside electrode can be used for grounding, or electrically biasing, the integrated circuits on the die. The backside electrode can be formed as a thin metal film that covers the entire backside, or covers just a portion of the backside of the die. The semiconducting substrate of a die can also act as an electrode in relation to the integrated circuits on the substrate.

For testing semiconductor dice having backside electrodes, it would be advantageous for a temporary package to have the capability to electrically contact the backside electrodes. This would allow ground and bias potentials to be applied through the backside electrodes during test procedures such as burn-in, failure analysis and full functionality testing. The present invention is directed to a temporary package for testing semiconductor dice with backside electrodes.

SUMMARY OF THE INVENTION

In accordance with the present invention, a temporary package, a method and a system for testing semiconductor dice having backside electrodes are provided. The temporary package includes: a base for retaining a single die; an interconnect for making electrical connections to contact locations on a face of the die; and a force applying mechanism for biasing the die against the interconnect. In addition, the temporary package includes a backside connection mechanism for electrically contacting the backside electrode on the die.

In an illustrative embodiment, the backside connection mechanism includes a conductive member, such as a metal plate, configured to contact the backside electrode. In addition, the conductive member is biased by the force applying mechanism of the package against the backside electrode. The backside connection mechanism also includes an electrical path between the conductive member and terminal contacts formed on the temporary package. The terminal contacts can be formed as pads, ball or pins configured to electrically connect to a test apparatus having test circuitry.

The electrical path between the conductive member and terminal contacts can include a wire attached to the conductive member and to a contact on the base. Alternately, electrical clips, springs, brushes, or buckle beams, can be used to form the electrical path. During a test procedure using the temporary package, the terminal contacts on the package can be placed in electrical communication with test circuitry, and test signals applied through the backside electrode to the integrated circuits on the die.

In an alternate embodiment temporary package, the electrical path from the conductive member to the terminal contacts is through a bridge clamp of the force distribution mechanism for the temporary package. In this embodiment the bridge clamp is configured to electrically contact a mating contact pad on the base of the temporary package.

In other alternate embodiments, the temporary package and terminal contacts can be formed in the configuration of a conventional semiconductor package. In these embodiments the force applying mechanism, rather than being a clamp and spring, can comprise a cover and spring member attachable to the base. Also in these embodiments the cover for the package can include a metal, conductive adhesive, conductive foam, or carbon filled elastomeric member, configured to contact both the backside electrode on the die and a contact pad on the base of the temporary package. These materials in addition to providing an electrical path from the backside electrode, also function as heat sinks for cooling the die during the test procedure.

A method for testing a die with a backside electrode includes the broad steps of: providing a temporary package with a backside connection mechanism; assembling the die in the temporary package; placing the temporary package in a testing apparatus in electrical communication with test circuitry; and then applying test signals through the backside connection mechanism to the backside electrode.

A system for testing a die with a backside electrode, broadly stated, includes: a temporary package with terminal contacts in electrical communication with a backside connection mechanism; and a testing apparatus configured to apply test signals through the terminal contacts and backside connection mechanism to the die.

BRIEF DESCRIPTION OF THE DRAWINGS

FIG. 1A is a schematic plan view of a prior art semiconductor die with a backside electrode, illustrating a face of the die and contact locations thereon;

FIG. 1B is a schematic cross sectional view of the die taken along section line 1B—1B of FIG. 1A;

FIG. 2 is a schematic cross sectional view of a temporary package constructed in accordance with the invention;

FIG. 2A is a schematic cross sectional view of an electrical clip for forming an electrical path on the temporary package of FIG. 2 to the backside electrode on the die;

FIG. 2B is a schematic cross sectional view of a conductive member with a carbon filled elastomeric layer thereon in contact with the backside electrode on the die;

FIG. 3 is a schematic cross sectional view of an alternate embodiment temporary package constructed in accordance with the invention wherein an electrical path to the backside electrode is through a force applying mechanism of the package;

DETAILED DESCRIPTION OF THE PREFERRED EMBODIMENTS

Figure 4:
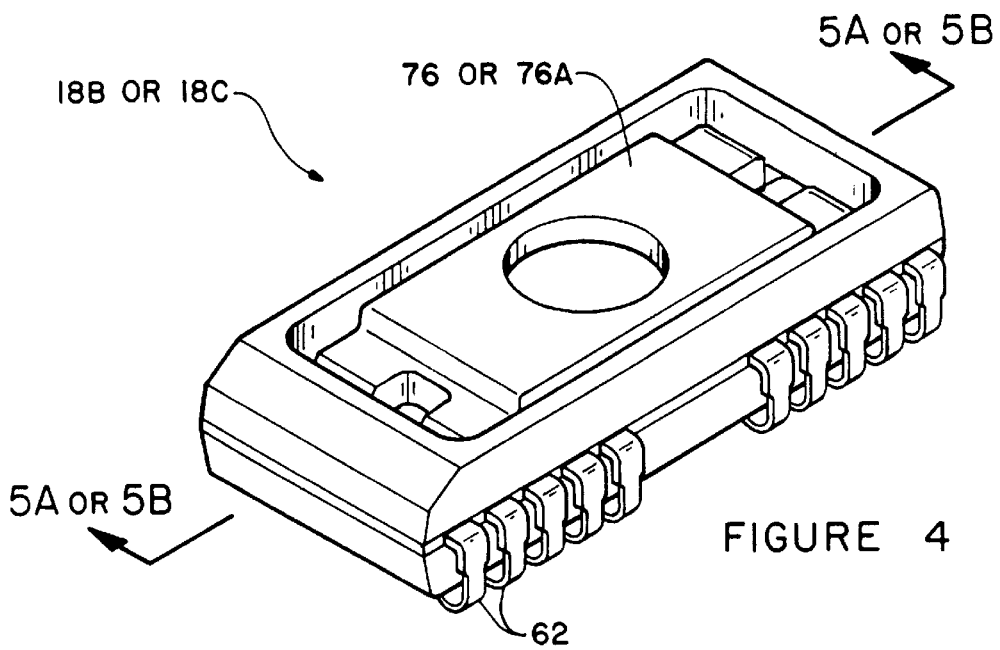
FIG. 4 is a perspective view of another alternate embodiment temporary package having a configuration similar to a conventional semiconductor package.

Referring to FIGS. 1A and 1B, a prior art semiconductor die 10 adapted for testing in accordance with the invention is illustrated. The die 10 includes a face 12 wherein patterns of contact locations 14 are located. The face 12 is also known as the "circuit side" of the die 10. The contact locations 14 can be bond pads, test pads, fuse pads or other electrical members that allow electrical access to the integrated circuits contained on the die 10.

In addition to the contact locations 14 on the face of the die 10, the die 10 also includes a backside electrode 16 (FIG. 1B). The backside electrode 16 comprises a metal layer formed on the backside of the die 10 in electrical communication with the integrated circuits on the die 10. The backside electrode 16 can cover the entire backside, or desired portions of the backside, of the die 10. In addition, the backside electrode 16 can be formed by the semiconducting substrate, or an area of the substrate, on the backside of the die. In general, the backside electrode 16 can be used to electrically bias or ground the integrated circuits formed on the die 10. In addition, the backside electrode 16 can be used to apply voltages useful for failure analysis and for detecting defects in the integrated circuits on the die 10.

Referring to FIG. 2, a temporary package 18 constructed in accordance with the invention is shown. The temporary package 18 is configured to house the die 10 for testing, and to provide electrical connections to the contact locations 14 (FIG. 1A) and backside electrode 16 of the die 10. In addition, the temporary package 18 is configured for placement in a testing apparatus, such as a burn-in board, in electrical communication with test circuitry 34. The test circuitry 34 is adapted to apply test signals to the integrated circuits on the die 10.

The temporary package 18, broadly stated, includes: a base 20 for retaining the die 10; an interconnect 22 for making temporary electrical connections to the contact locations 14 (FIG. 1A) on the die 10; and a force applying mechanism 24 for biasing the die 10 against the interconnect 22. The temporary package 18 also includes a backside connection mechanism 26 for electrically connecting the backside electrode 16 on the die 10 to the test circuitry 34. The backside connection mechanism 26 includes: a conductive member 28 for electrically contacting the backside electrode 16 on the die 10; a contact pad 30 formed on the base 20; and a wire 32 electrically connected to the conductive member 28 and to the contact pad 30.

Figure 8:
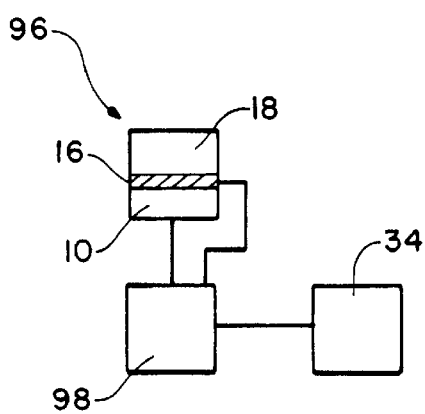
FIG. 8 is a schematic view of a system constructed in accordance with the invention.

In the illustrative embodiment, the base 20 of the temporary package can comprise a multi-layered ceramic, or molded-plastic structure, having conductive traces 38 and patterns of terminal contact 36. The terminal contacts 36 can be formed as flat metal pads as shown, or as balls, pins or other members as required. The terminal contacts 36 are adapted for electrical connection with mating electrical connectors (not shown) such as clips, slides or pogo pins associated with a socket or board of a testing apparatus 98 (FIG. 8). Other external or internal conductive traces (not shown) can be formed in the base 20 to provide an electrical path from the contact pad 30 for the backside connection mechanism 26 to the terminal contacts 36 on the base 20.

The base 20 can also include a cavity 37 for retaining the die 10 and interconnect 22. An adhesive layer 39 can be used to secure the interconnect 22 to the base 20. Bond wires 46 can be wire bonded to the interconnect 22 and to the conductive traces 38 on the base 20 to provide a conductive path therebetween. The base 20 can also include a through opening 40 to facilitate installation and removal of the interconnect 22. In addition, the base 20 can include a pair of through openings 42, 44 for attaching the force applying mechanism 24. Methods for forming the base 20 substantially as shown are disclosed in U.S. Pat. No. 5,519,332, incorporated herein by reference.

In the assembled package 18, the die 10 is placed face down on the interconnect 22. As will be further explained, the interconnect 22 includes contact members 49 (FIG. 7) configured to electrically contact the contact locations 14 (FIG. 1A) on the face of the die 10. The force applying mechanism 24 biases the die 10 against the interconnect 22 to maintain the electrical connections between the contact members 49 and contact locations 14. In addition, as will be further explained, the force applying mechanism 24 also biases the conductive member 28 of the backside connection mechanism 26 against the backside electrode 16.

The force applying mechanism 24 includes a bridge clamp 50 and a spring 52. The bridge clamp 50 includes mounting tabs 56, 58 configured for placement through the openings 42, 44 in the base 20 to engage the lower surface of the base 20. The bridge clamp 50 and spring 52 can be formed of a flexible material such as steel. The spring 52 can be a flat, bendable member sized and shaped to exert a predetermined biasing force through the conductive member 28 to the die 10 and interconnect 22. In addition tensioning from the spring 52 secures the bridge clamp 50 to the base 20. The bridge clamp 50, spring 52 and conductive member 28 include aligned openings 54A, 54B, 54C used during assembly of the package 18.

Assembly of the package 18 can be as outlined in the previously incorporated U.S. Pat. No. 5,519,332. During a test procedure using the package 18, electronic test signals can be applied by the test circuitry 34 through the terminal contacts 36 on the base 20, through the internal conductive traces (not shown) in the base 20, through the wire 32, and through the conductive member 28 to the backside electrode 16 on the die 10.

The conductive member 28, in addition to providing a conductive path to the backside electrode 16, also functions to conduct heat away from the die 10 for cooling. The conductive member 28 can be a flat plate formed of a highly conductive metal such as copper or aluminum. In the embodiment illustrated in FIG. 2, the wire 32 can be permanently bonded to the conductive member 28 and to the contact pad 30 on the base 20 by soldering, welding or similar connection mechanism. A desired amount of slack can be formed in the wire 32 to allow assembly and disassembly of the package 10.

Alternately as shown in FIG. 2A, the wire 32 can be secured to the conductive member 28 using a non-bonded clipping mechanism 60. The clipping mechanism 60 can be an alligator clip, a clamp, a buckle beam, a spring or some other non-bonded electrical connector useful for forming an electrical path.

Another alternate is shown in FIG. 2B, wherein the conductive member 28 includes a carbon filled elastomeric layer 29. The carbon filled elastomeric layer 29 in addition to conducting electricity is an efficient heat sink for cooling the die 16 during the test procedures.

Referring to FIG. 3, an alternate embodiment temporary package 18A is shown. The package 18A includes a base 20A, a conductive member 28A, a bridge clamp 50A, and a spring 52A constructed substantially as previously described. However, in this embodiment the contact pads 30A for the backside connection mechanism are configured for mating electrical engagement with the mounting tabs 56A, 58A of the bridge clamp 50A. In FIG. 3, a current path (I) from the backside electrode 16 to the contact pads 30A is indicated by the arrows. This electrical path is through the spring 52A and the bridge clamp 50A to the contact pads 30A. The contact pads 30A can be configured for electrical connection to the test circuitry 34. Alternately the contact pads 30A can be in electrical communication with the terminal contacts 36A which are connectable to the test circuitry 34.

Figure 5A:
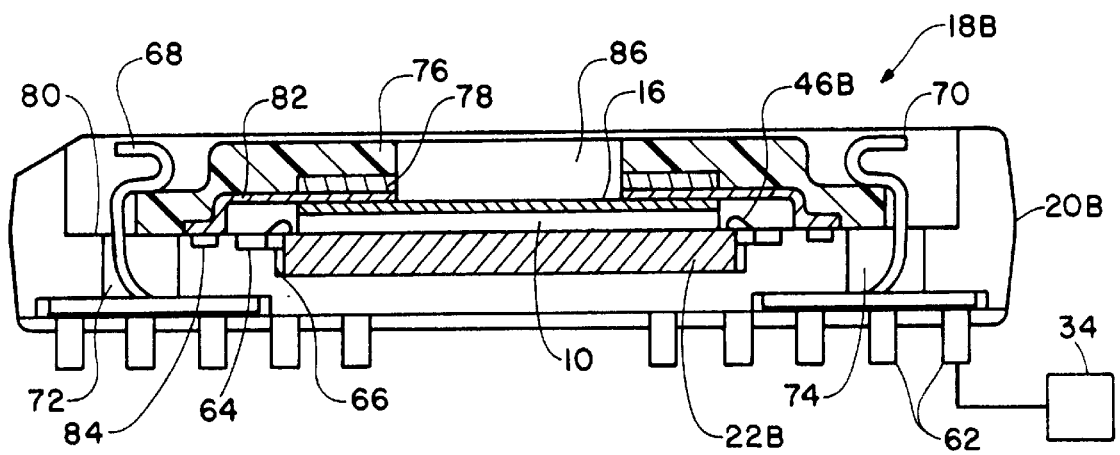
FIG. 5A is a cross sectional view taken along section line 5A—5A of FIG. 4.
Figure 5B:
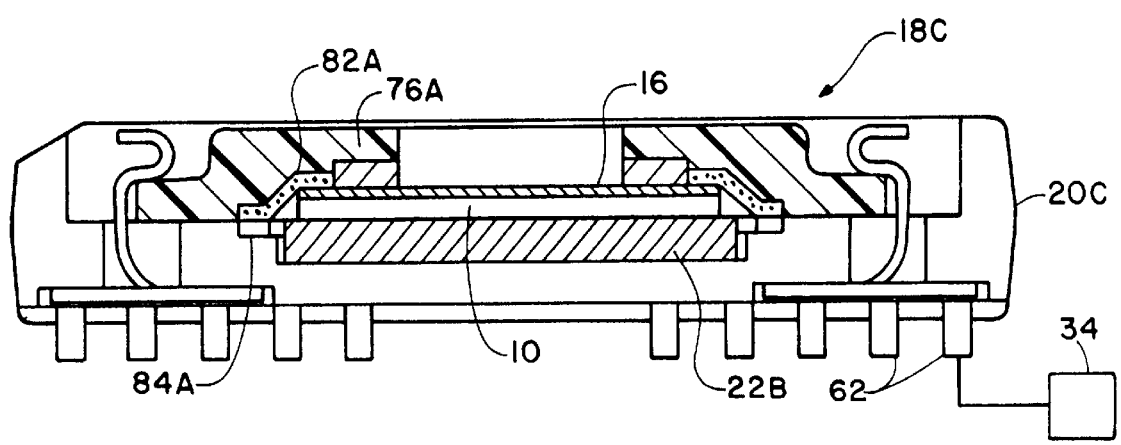
FIG. 5B is an alternate embodiment cross sectional view equivalent to FIG. 5A.

Referring to FIGS. 4–5B, alternate embodiment temporary packages 18B (FIG. 5A) and 18C (FIG. 5B) are illustrated. As shown in FIG. 5A, temporary package 18B includes a base 20B having terminal contact pins 62. The base 20B can be formed of ceramic or molded plastic as previously described. In addition, the size and configuration of the base 20B and the size and configuration of the terminal contact pins 62 can be substantially equivalent to a conventional plastic or ceramic semiconductor package. For example, the base 20B and terminal contact pins 62 can be formed as SOJ (small outline j-bend), DIP (dual in line package), ZIP (zig zag in line package), LCC (leadless chip carrier), SOP (small outline package), QFP (quad flat pack), TSOP (thin small outline package), SOJ (small outline j-bend), PGA (pin grid array), LGA (land grid array) or BGA (ball grid array) packages.

As also shown in FIG. 5A, an interconnect 22B is mounted within a recess 66 formed in the base 20B. The interconnect 22B can be formed substantially as previously described for interconnect 22 and includes contact members configured to electrically contact the contact locations 14 (FIG. 1A) on the face of the die 10. The interconnect 22B can be electrically attached via bond wires 46B to internal conductive traces 64 formed on the base 20B. The conductive traces 64 are in electrical communication with the terminal contact pins 62 on the base 20B.

A force applying mechanism for biasing the die 10 against the interconnect 22B includes a cover 76 and a spring member 78. The cover 76 is sized for flush mounting within a cavity 80 in the base 20B. Slide clips 68, 70 attach to openings 72, 74 formed in the base 20B for attaching the cover 76 to the base 20B. In addition, the cover 76 includes an opening 86 used during assembly of the package 18B. Further details of the above described components of the temporary package 18B are disclosed in U.S. patent application Ser. No. 08/580,687, incorporated herein by reference.

Still referring to FIG. 5A, the cover 76 for the temporary package 18B includes a conductive member 82. The conductive member 82 can be formed separately and then attached to the cover 76. Alternately the conductive member 82 can be a layer of material formed integrally with the cover 76 using a deposition process such as spin-on or CVD. The conductive member 82 can be located within a recess in the cover 76. In addition, the conductive member can be biased against the backside electrode 16 on the die 10 by the spring member 78. The conductive member 82 can comprise a highly conductive metal, such as copper or aluminum. Alternately, the conductive member 82 can comprise a carbon filled elastomer or a conductive loaded foam. These materials are sold by Jabar of Andover, N.J, and Bisco of Elk Grove Ill.

The conductive member 82, in addition to electrically contacting the backside electrode 16, also electrically engages contact pads 84 formed on the base 20B. The contact pads 84 are in electrical communication with internal conductive traces (not shown) and selected terminal contact pins 62 on the base 20B. An electrical path is thus provided from the backside electrode 16, through the conductive member 82, through the contact pads 84, through the terminal contact pins 62 and to the test circuitry 34.

Referring to FIG. 5B, alternate embodiment temporary package 18C is shown. The temporary package 18C is formed substantially the same as temporary package 18B. However, in this embodiment the electrical connection between the backside electrode 16 on the die 10 and the contact pads 84A on the base 20C is through a conductive adhesive conductive member 82A. The conductive adhesive conductive member 82A can be formed of a material that is conductive in all directions, such as a metal filled epoxy, or a material that is conductive in one direction only, such as a z-axis anisotropic adhesive.

With a z-axis anisotropic adhesive, compression of the conductive member 82A by the cover 76A compresses the conductive member 82A in z-directions to form the electrical path between the backside electrode 16 on the die 10, and the contact pads 84A on the temporary package 18C. Suitable conductive adhesives are sold under the trademarks: "X-POLY" and "Z-POXY", by A.I. Technology, Trenton, N.J.; and "SHELL-ZAC", by Sheldahl, Northfield, Minn. Conductive adhesives are also sold by 3M, St. Paul, Minn.

Figure 6:
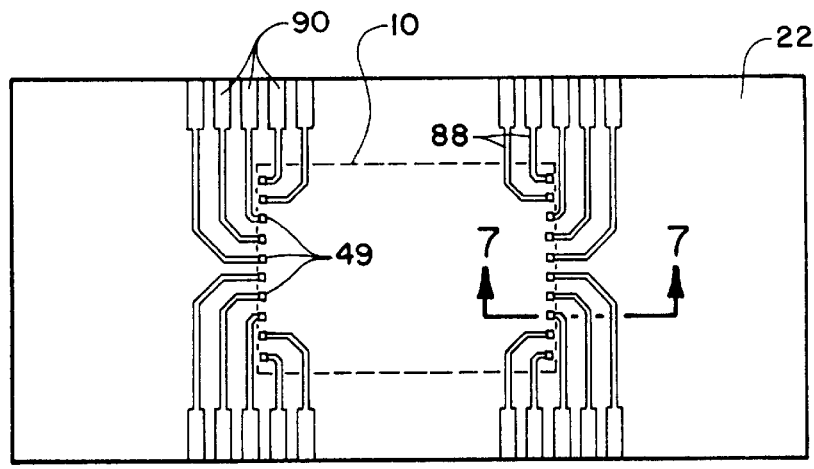
FIG. 6 is a plan view of an interconnect for the temporary packages.
Figure 7:
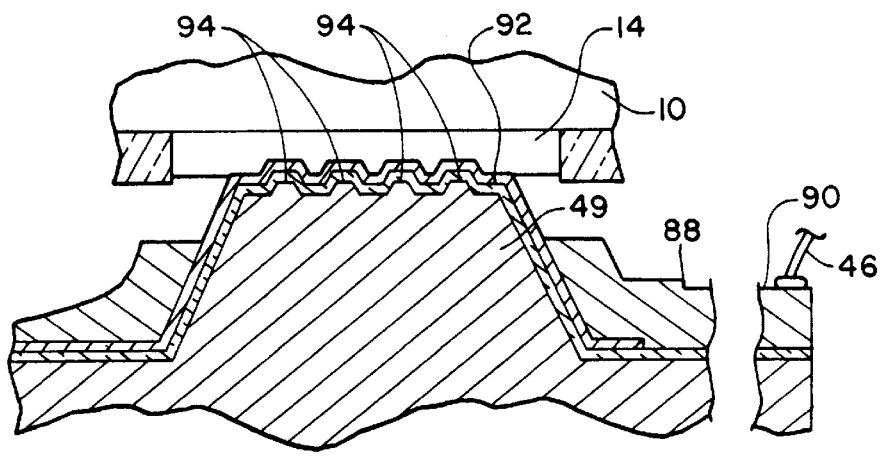
FIG. 7 is an enlarged cross sectional view of a contact member for the interconnect taken along section line 7—7 of FIG. 6.

Referring to FIGS. 6 and 7, the interconnect 22 for the temporary package 18 is illustrated separately. In FIG. 6, the outline of the semiconductor die 10 is superimposed on the interconnect 22. The interconnect 22 includes patterns of contact members 49 and patterns of conductors 88 in electrical communication with the contact members 49. The patterns of the contact members 49 match the patterns of the contact locations 14 (FIG. 1A) on the die 10.

The conductors 88 on the interconnect 22 can include bonding pads 90 for wire bonding the bond wires 46 (FIG. 2). As shown in FIG. 7, each contact member 49 includes a conductive layer 92 formed in electrical communication with a corresponding conductor 88. In addition, each contact member 49 includes penetrating projections 94 configured to penetrate the contact locations 14 on the face of the die 10 to a limited penetration depth. Further details of the interconnect 22, including methods of fabrication, are disclosed in the previously incorporated U.S. Pat. Nos. 5,519,332 and 5,815,000. Interconnect 22B (FIG. 5A) can be substantially similar to interconnect 22.

Referring to FIG. 8, a system 96 constructed in accordance with the invention and including the temporary package 18 is shown. The system 96 includes a testing apparatus 98, such as a burn-in board wherein the temporary package 18 can be mounted. Alternately temporary packages 18A, 18B or 18C could be utilized in place of temporary package 18. The testing apparatus 98 includes, or is in electrical communication with the test circuitry 34. The test circuitry 34 is configured to apply test signals to the integrated circuits and semiconductor devices formed on the die 10.

During a test procedure, the die 10 is assembled in the temporary package 18. For assembling the temporary package 18, the contact members 49 (FIG. 7) on the interconnect 22 can be aligned with the contact locations 14 (FIG. 7) on the die 10. Following alignment, the contact members 49 and contact locations 14 can be placed into electrical contact and the bridge clamp 50 (FIG. 2) secured to the base 20. One method for aligning and assembling the temporary package 18 is with a tool similar to an aligner bonder tool used for flip chip bonding semiconductor dice to a substrate. Such a method is described in more detail in the previously incorporated U.S. Pat. No. 5,519,332.

In the assembled temporary package 18, the bridge clamp 50 (FIG. 2) biases the die 10 and the interconnect 22 (FIG. 2) together. In addition, the bridge clamp 50 presses the conductive member 28 (FIG. 2) against the backside electrode 16 on the die 10. This provides a conductive path from the backside electrode 16 through the temporary package 18 to the testing apparatus 98 and the test circuitry 34. Test signals can then be applied by the test circuitry 34 to the backside electrode 16 as required.

Thus the invention provides an improved temporary package for semiconductor dice with backside electrodes. The temporary package can be used in a test process for testing the dice. In addition, the temporary package can be part of a system for testing the dice. While the invention has been described with reference to certain preferred embodiments, as will be apparent to those skilled in the art, certain changes and modifications can be made without departing from the scope of the invention as defined by the following claims.

What is claimed is:

1. A temporary package for testing a semiconductor die having a circuit side with a plurality of first contacts thereon, and a backside with a backside electrode thereon, comprising:
   a base for retaining the die comprising a plurality of terminal contacts configured for electrical communication with a test circuitry;
   an interconnect on the base comprising a plurality of second contacts configured to electrically contact the first contacts on the circuit side of the die and configured for electrical communication with the test circuitry; and
   a connection mechanism on the base configured to electrically contact the backside electrode and provide an electrical path to a selected terminal contact on the base.

2. The package of claim 1 wherein the connection mechanism comprises an electrically conductive plate configured to contact the backside electrode and a wire attached to the plate in electrical communication with the selected terminal contact.

3. The package of claim 1 wherein the connection mechanism comprises an electrically conductive clamp and spring attachable to the base configured to electrically contact the backside electrode and to bias the die against the interconnect.

4. The package of claim 1 wherein the connection mechanism comprises an electrically conductive clamp configured to directly contact the selected terminal contact on the base and an electrically conductive spring on the clamp configured to bias the die against the interconnect.

5. The package of claim 1 wherein the electrical path comprises an electrically conductive force applying mechanism configured to bias the die and the interconnect together.

6. The package of claim 1 wherein the electrical path comprises an electrically conductive force applying mechanism configured to bias the die and the interconnect together and to contact the selected terminal contact on the base.

7. A temporary package for testing a semiconductor die having a circuit side with a plurality of first contacts thereon, and a backside with a backside electrode thereon, comprising:
   a base for retaining the die comprising a plurality of terminal contacts;
   an interconnect on the base comprising a plurality of second contacts in electrical communication with selected terminal contacts and configured to electrically contact the first contacts on the die; and
   a force applying mechanism for biasing the die and the interconnect together comprising an electrically conductive clamp attached to the base, and an electrically conductive spring attached to the clamp, the clamp and the string configured to provide an electrical path between the backside electrode and a selected terminal contact on the base.

8. The package of claim 7 wherein the force applying mechanism further comprises an electrically conductive plate configured to contact the spring and the backside electrode.

9. The package of claim 7 wherein the clams and the spring comprise a metal.

10. The package of claim 7 wherein the force applying mechanism comprises an electrically conductive plate for contacting the backside electrode and a wire attached to the plate in electrical communication with the selected terminal contact.

11. The package of claim 7 wherein the clamp attaches to an opening in the base.

12. The package of claim 7 wherein the force applying mechanism comprises a plate for contacting the backside electrode, and a wire forming the electrical path between the plate and the selected terminal contact.

13. A temporary package for testing a semiconductor die having a circuit side with a plurality of first contacts thereon, and a backside with a backside electrode thereon, comprising:
   a base for retaining the die comprising a plurality of terminal contacts configured for electrical communication with test circuitry, and a contact pad in electrical communication with a selected terminal contact;
   an interconnect on the base comprising a plurality of second contacts in electrical communication with selected terminal contacts and configured to electrically contact the first contacts on the circuit side of the die; and
   a force applying mechanism for biasing the die and the interconnect together, the mechanism comprising an electrically conductive clamp and an electrically conductive spring attached to the base in electrical contact with the contact pad and with the backside electrode.

14. The package of claim 13 and further comprising an electrically conductive plate between the spring and the backside electrode.

15. The package of claim 14 wherein the conductive plate comprises a material selected from the group consisting of metal, carbon filled elastomer, conductive adhesive and conductive foam.

16. A method for testing a semiconductor die having a first side with a plurality of first contacts thereon and a second side with a backside electrode thereon comprising:

providing a temporary package for the die comprising a plurality of terminal contacts configured for electrical communication with test circuitry, an interconnect comprising a plurality of second contacts in electrical communication with selected terminal contacts configured to electrically contact the first contacts on the die, and a force applying mechanism configured to bias the die and the interconnect together, the mechanism in electrical communication with a selected terminal contact and configured to electrically contact the backside electrode to provide an electrical path from the selected terminal contact to the backside electrode;

applying test signals through the selected terminal contacts and the second contacts on the interconnect to the first contacts on the die; and applying test signals through the selected terminal contact and the force applying mechanism to the backside electrode on the die.

17. The method of claim 16 wherein the force applying mechanism comprises an electrically conductive clamp and an electrically conductive spring.

18. The method of claim 16 wherein the force applying mechanism comprises an electrically conductive clamp and an electrically conductive spring, the clamp configured to electrically engage a contact on the base in electrical communication with the selected terminal contact.

19. The method of claim 16 wherein the force applying mechanism comprises an electrically conductive plate attached to a wire in electrical communication with the selected terminal contact.

20. A method for testing a semiconductor die having a first side with a plurality of first contacts thereon and a second side with a backside electrode thereon comprising:

providing a test circuitry configured to apply test signals to the die;

providing a temporary package for the die comprising:
- a base for retaining the die comprising a terminal contact in electrical communication with the test circuitry, and a contact pad in electrical communication with the terminal contact;
- a clamp and a spring attached to the base in electrical contact with the contact pad; and
- a conductive plate pressed against the backside electrode by the spring;

assembling the die in the temporary package;

placing the terminal contact on the temporary package in electrical communication with the test circuitry; and applying test signals through the terminal contact and the conductive plate to the backside electrode.

21. The method of claim 20 wherein the clamp includes a tab configured to electrically contact the contact pad.

22. A system for testing a semiconductor die having a first side with a plurality of first contacts thereon and a second side with a backside electrode thereon comprising:

a testing apparatus in electrical communication with test circuitry configured to apply test signals to the die; and a temporary package for the die comprising a base for retaining the die, a plurality of terminal contacts on the base, a contact on the base in electrical communication with a selected terminal contact, an interconnect on the base comprising a plurality of second contacts in electrical communication with selected terminal contacts and configured to electrically contact the first contacts on the die, a force applying mechanism configured to bias the die and the interconnect together and configured to electrically contact the contact and the backside electrode to provide a conductive path therebetween.

23. The system of claim 22 wherein the force applying mechanism comprises a spring member and an electrically conductive plate for contacting the backside electrode.

24. The system of claim 22 wherein the testing apparatus comprises a burn-in board.

* * * * *

UNITED STATES PATENT AND TRADEMARK OFFICE
CERTIFICATE OF CORRECTION

| | | |
|---|---|---|
| PATENT | : | 6,060,894 |
| DATED | : | May 9, 2000 |
| INVENTOR(S) | : | DAVID R. HEMBREE, SALMAN AKRAM, WARREN M. FARNWORTH, JAMES M. WARK |

It is certified that error appears in the above-identified patent and that said Letters Patent is hereby corrected as shown below:

In claim 7 @ column 8, line 23, change "string" to --spring--;

In claim 7 @ column 8, line 29, change "clams" to --clamp--.

Signed and Sealed this

Twentieth Day of March, 2001

Attest:

NICHOLAS P. GODICI

*Attesting Officer*     *Acting Director of the United States Patent and Trademark Office*